(12) United States Patent
Heerema et al.

(10) Patent No.: US 8,860,400 B2
(45) Date of Patent: Oct. 14, 2014

(54) SYSTEMS AND METHODS FOR PROVIDING SIGNAL ANALYSIS DATA

(75) Inventors: Mark D. Heerema, Santa Rosa, CA (US); Corydon J. Boyan, Santa Rosa, CA (US); Gordon Strachan, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 1880 days.

(21) Appl. No.: 11/862,862

(22) Filed: Sep. 27, 2007

(65) Prior Publication Data

US 2009/0085555 A1 Apr. 2, 2009

(51) Int. Cl.
*G01R 23/18* (2006.01)

(52) U.S. Cl.
CPC ..................... *G01R 23/18* (2013.01)
USPC ...................................... 324/76.19

(58) Field of Classification Search
USPC ...................................... 324/76.19
See application file for complete search history.

(56) References Cited

U.S. PATENT DOCUMENTS 5,105,380 A * 4/1992 Owechko ....................... 708/819
5,579,463 A * 11/1996 Takano et al. ................. 345/440
6,229,536 B1 * 5/2001 Alexander et al. ............. 345/440.1
6,725,172 B2 * 4/2004 McTigue et al. ............... 702/117
7,459,898 B1 * 12/2008 Woodings ..................... 324/76.19
2005/0261847 A1 * 11/2005 Nara ................................ 702/76

FOREIGN PATENT DOCUMENTS

JP 07209352 8/1995

OTHER PUBLICATIONS

Agilent Technologies, User's/Programmer's Reference, Agilent Technologies ESA Series Spectrum Analyzers, Jul. 2002, pp. 133-137.
Agilent Technologies, User's Reference, Agilent Technologies 16533A 1-GSa/s and 16534A 2-GSa/s Digitizing Oscilloscope (16500-series only), Publication No. 16534-97014, Mar. 2002, pp. ii, 7-1 to 7-8, 9-1 to 9-11.
"The Waveform Selection Menu", Publication No. 16534-97014, Published with Agilent Technologies 16533A 1-GSa/s and 16534A 2-GSa/s Digitizing Oscilloscope (16500-series only), Mar. 2002.
Final Office Action mailed Sep. 13, 2013 in Japanese Patent Application No. 2008-220928.

* cited by examiner

*Primary Examiner* — Jeff Natalini

(57) ABSTRACT

A method for displaying signal analysis data comprises performing a plurality of sweep operations upon a received signal. With the sweep operations, spectral analysis is performed upon a first frequency band of the received signal. Displays are rendered of data generated from the spectral analysis in the first band and a second band different from the first band simultaneously, and the displays in the first band and the second bands are updated according to the sweep operations.

19 Claims, 4 Drawing Sheets ured pixel. 640×480 pixels). Once desktop space and menu space are taken into account, there are approximately 550 pixels available to display the 8192 data points. In this particular example, this translates to about fifteen data points per available pixel (8192/550). In the past, the end user given this issue, would generally choose to narrow the measured span or to split the screen with a wide span at the top and a narrow span at the bottom. However, simply switching to a narrower span display does not allow the user to visualize the full signal. Also, as noted above, prior art, non-synchronous split screens are often inadequate, especially for time-varying signals.

SYSTEMS AND METHODS FOR PROVIDING SIGNAL ANALYSIS DATA

TECHNICAL FIELD

The present description relates, in general, to signal analysis and, more specifically, to spectral analysis.

BACKGROUND

A variety of spectral analyzer models are available on the market currently. Generally, spectral analyzers display frequency domain information for a received signal. Thus, in one example, a spectral analyzer provides a graph that shows frequency on the x-axis and amplitude on the y-axis, thereby giving a user an indication of the relative strengths of various signal components. Generally, the screen is continuously updated as data is generated. An example display of a prior art spectral analyzer is shown in FIG. 1.

Some legacy spectral analyzers provide a user with a split screen display. On the top of the screen is a display of the spectral information in a relatively wide band (i.e., a large scan), and on the bottom is a display of the spectral information for a relatively narrow band within the wide band (i.e., a zoom screen). However, such displays are non-synchronous in that they are limited to having only a single actively updated screen at a time. In other words, legacy analyzers generate data to update one screen or the other at a given time. Thus, a user can toggle between screens, but only one of the screens will appear to the user to be updating at any given time. Further, such analyzers are operable to perform sweep operations in the span of the large screen or in the span of the zoom screen, but not at the same time. Some early legacy spectral analyzers have been limited by a lack of precision in sweeps over wide frequency spans and also a limit to the number of data points collected during a sweep. These two shortcomings force users to evaluate signals by examining spectrum in wide frequency spans, looking for signals of interest, then switching measurement to narrow spans in order to evaluate the characteristics of signals.

Non-synchronous zooms can be acceptable in situations wherein the signal of interest is constant with time. In such examples, a single sweep in a wide span and a single sweep in a narrow span would produce a useful display, since the smaller span screen would faithfully reproduce a zoomed portion of the larger span screen. Most real-world signals, though, are time-varying, such that measurements at two separate times, in effect, measure two different signals.

Some more advanced modern day spectral analyzers have synthesized sweeps over wider arbitrary spans (greater than 10 MHz) and can measure into the thousands of data points. Such data provides visual insight when remotely measured and processed with a computer. For users wanting to make manual measurements with their spectral analyzers, the limit of the display (typically Video Graphics Array (VGA) or Extended Graphics Array (XGA)), offers far fewer pixels than display points measured. FIG. 2 shows a display from a prior art spectral analyzer.

In the example of FIG. 2 a measurement is being taken from 300 to 1000 MHz. The screen attempts to show 8192 total data points that are collected. On this particular instrument the display is VGA (640×480 pixels). Once desktop space and menu space are taken into account, there are approximately 550 pixels available to display the 8192 data points. In this particular example, this translates to about fifteen data points per available pixel (8192/550). In the past, the end user given this issue, would generally choose to

BRIEF SUMMARY

Various embodiments of the present invention are directed to systems and methods for providing synchronized displays for at least two separate bands of a signal. One example system includes a signal input in communication with a sweeping component to examine portions of the signal at a number of different frequency portions. The data is sampled, digitized, and processed to produce synchronized displays. Thus, the example system provides a graph of a wide span of the spectrum and another graph of a narrower span of the spectrum. Both graphs are continuously updated together, such that a user can see both graphs change together over time.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
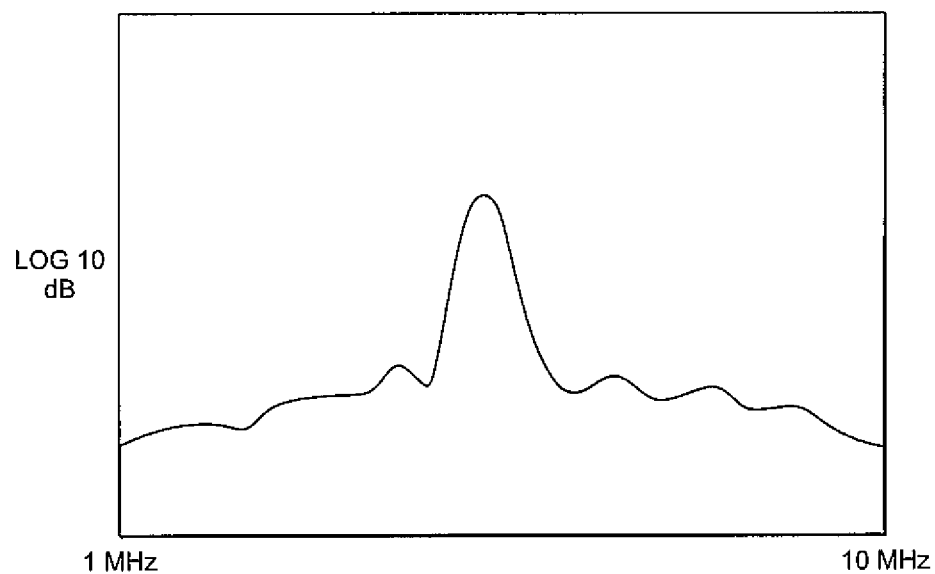
FIG. 1 is a display from a prior art spectral analyzer.
Figure 2:
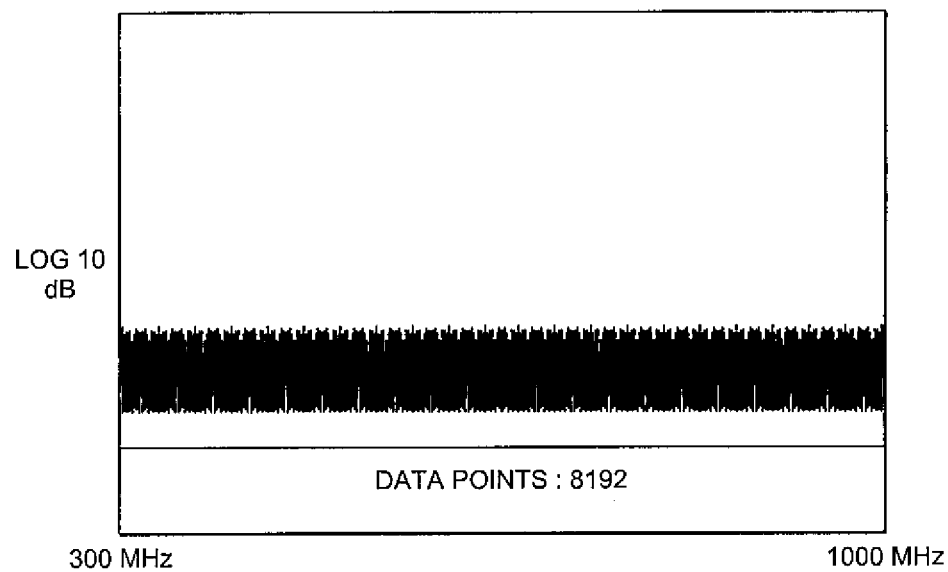
FIG. 2 is a display from a prior art spectral analyzer.
Figure 3:
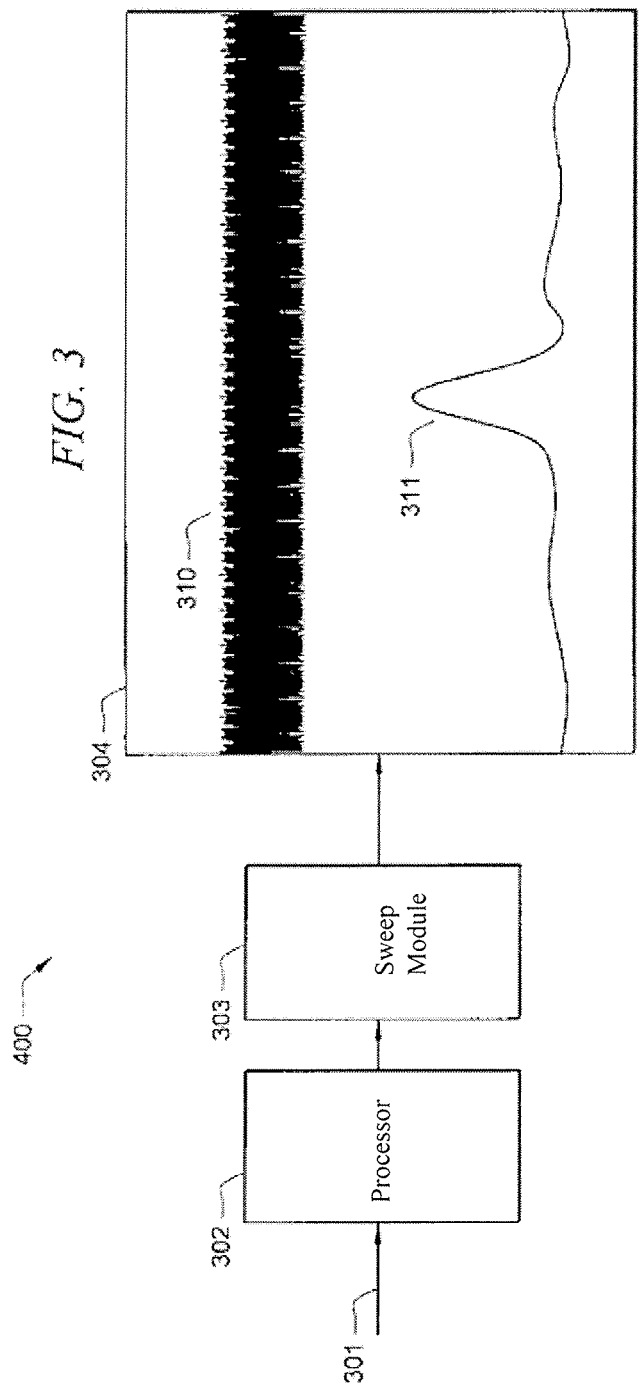
FIG. 3 is an illustration of an exemplary system adapted according to one embodiment of the invention.

FIG. 3 is an illustration of exemplary system 300 adapted according to one embodiment of the invention. System 300 includes signal input 301, sweep module 302, processor 303, and display 304.

In some examples, signal input 301 includes a high-bandwidth digital or analog signal. The input signal may be received from a signal generator, a device under test (e.g., a cellular phone component), or the like. Sweep module 302 is operable to generate spectrum data from the signal by performing a series of sweep operations (usually a continuous series for as long as a user desires) upon the input signal. In this example embodiment, sweep module 302 includes a Phase Locked Loop (PLL) that can fully synthesize over one Gigahertz of bandwidth with less than 0.5% of variance. However, other spans and variances are able to be accommodated by a variety of embodiments. For a given span, sweep module 302 uses the PLL to control a bandpass filter or receiver (e.g., a superheterodyne receiver) to provide portions of the signal at a variety of frequency points along the span. Each traversal over the span is a "sweep."

In many embodiments, an Analog-to-Digital Converter (ADC) receives the output from the filter or receiver and performs sampling thereon. The ADC also transforms the samples into digital data before the data is analyzed. The ADC may be included in sweep module 302 or may even be a component separate from either sweep module 302 or processor 303. Further, in many embodiments processor 303 includes the ADC.

Processor 303 processes the samples to analyze the signal. For instance, processor 303 is operable to discern the various frequencies contained in the input signal. Processor 303 also generates display 304, which is rendered in a humanly-perceptible form. In this example, display 304 is a graph that can be rendered upon, for example, a computer monitor or other screen. The functionality of processor 303 can be provided by a variety of means, including hardwired logic, computer-executable code, and the like. Processor 303 can be any of a variety of semiconductor devices, including, e.g., a general purpose processor, a Digital Signal Processor (DSP), an Application Specific Integrated Circuit (ASIC), or the like.

Display 304 includes large scan graph 310 and zoom graph 311, both of which are continuously updated. In one example, large scan graph 310 has a span of 700 MHz, whereas zoom graph 311 has a span of 7 MHz. Accordingly, a user of system 300 is able to view a very wide portion of the signal, while at the same time viewing a narrower band of interest. Further, should large scan graph 310 include many more data points than available pixels, a user can employ zoom screen 311 to extract more meaningful information. It should be noted that while this example includes respective bands of 700 MHz and 7 MHz, the invention is not limited thereto, as many embodiments are operable to analyze and display information for any arbitrary span.

Further, example system 300 can be configured in a number of ways. In one example embodiment, system 300 is included in a stand-alone spectral analyzer with its own user interface, controls, and display unit. In another example embodiment, input 301 and sweep module 302 are separate from processor 303, which is included in a general purpose computer. For instance, input 301 and sweep module 302 can be in a stand-alone piece of hardware or in a card that is interfaced to the general purpose computer through a data bus. The invention is not limited to these two example configurations, as any configuration now known or later developed may be employed.

Figure 4:
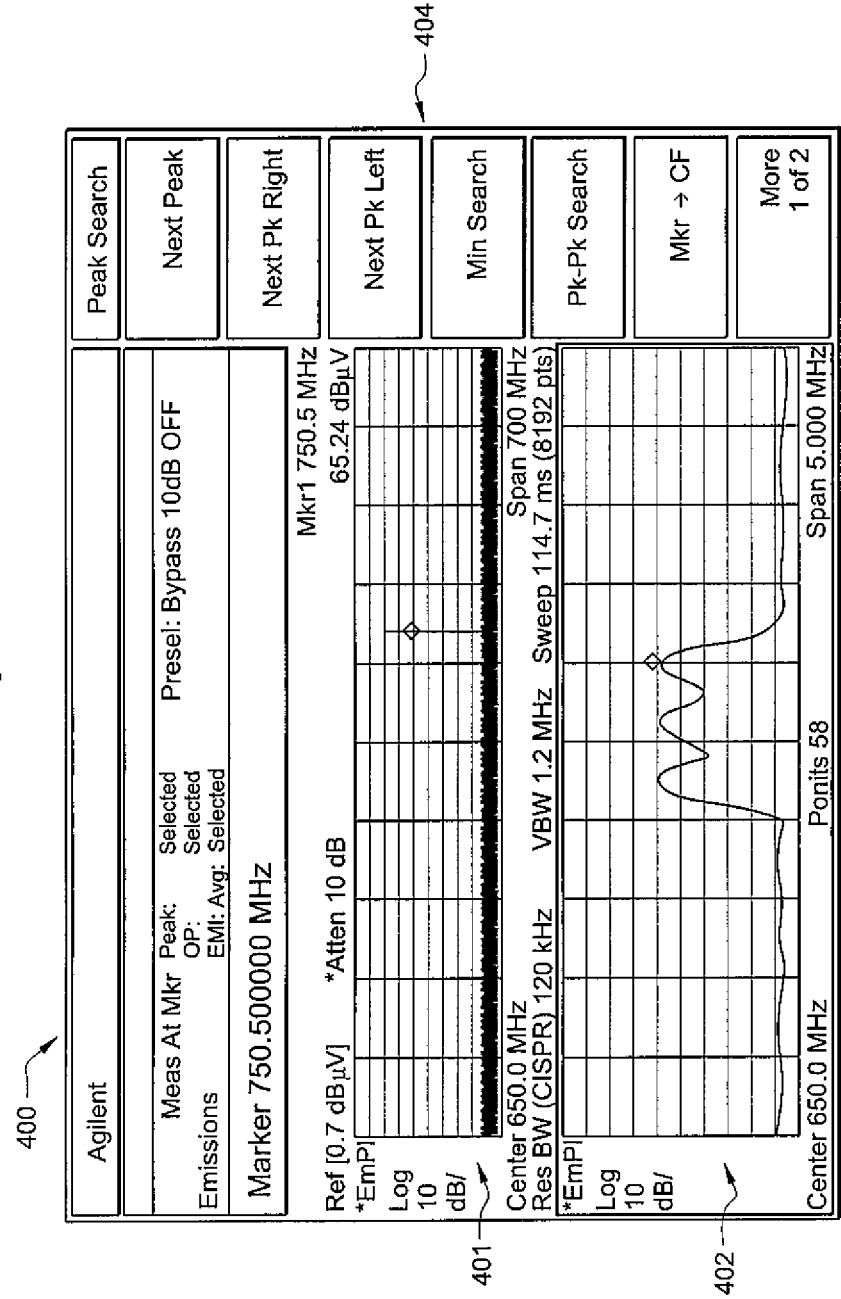
FIG. 4 is an illustration of an exemplary display adapted according to one embodiment of the invention.

FIG. 4 is an illustration of exemplary display 400 adapted according to one embodiment of the invention. Display 400 includes large scan graph 401 and zoom graph 402, similar to that described above with regard to FIG. 3. Display 400 serves as a user interface in this embodiment, as well. For instance, display 400 includes a moveable marker labeled "1" in both graphs 401 and 402 and also includes action menu 404, with "soft" buttons with which a user can interact.

It can be seen in graph 401 that the number of data points in the span is 8192, which is greater than the number of available pixels. Thus, some information is lost in graph 401. Graph 402 shows information from a significantly narrower band (5 MHz versus 700 MHz) and with only fifty-eight data points. The center of graph 402 shows three different signal components, which are indistinguishable in graph 401. Further, as noted above, graphs 401 and 402 are synchronized, such that they are continuously updated together. Thus, the user is provided with timely data for both graphs 401 and 402. Such feature stands in contrast to prior art split-screen systems that force a user to choose only one graph for measurement at a time.

In some embodiments, synchronized displays of different spans allow for one or more additional features. For instance, it is possible to constrain a zoom graph (e.g., graph 402) such that it is limited to a span with no more data points than available pixels. In one example, the maximum pixels available in a zoom graph is 462. One technique uses four values to determine a maximum span of the zoom graph-1) left boundary of large span graph (e.g., graph 401), 2) right boundary of large span graph, 3) number of pixels available in zoom graph, and 4) number of sweep data points. In this example, the span is an arbitrary span set at 29.85 MHz, stretching from 0.145 MHz to 29.995 MHz. This example span is different from that of FIG. 4; however, the smaller span should make for slightly more simplified math. Additionally, the number of data points is 8192, which is the same as in FIG. 4.

The frequency step represented by each data point in the large span graph is calculated by dividing the large span by the number of data points. In this example, the calculation yields 3.644 KHz per data bit. The maximum span of the zoom graph is calculated by multiplying the frequency step by the number of available pixels. In this case, the calculation gives a maximum span of 1.6835 MHz for the zoom graph. When the zoom span is set to the maximum span, each data point in the zoom span is represented by one pixel. When a user selects a span of the zoom graph that is larger than the maximum span, the zoom graph can then be automatically limited to the maximum span or less, as in the following examples.

In the first example, a user sets the center frequency of the zoom graph to 25 MHz, and the span of the zoom graph to 1 MHz. In this case, the span is less than the maximum span, which is legal. The center frequency and span are then set.

In a second example, a user sets the center frequency of the zoom graph to 25 MHz and the span of the zoom graph to 10 MHz. Since the span exceeds the maximum span, the system automatically reduces the span to 1.6835 MHz.

In a third example, the user sets the center frequency of the zoom graph to 29.5 MHz and the span of the zoom graph to 1 MHz. The set span can be envisioned as one half of the span to the left of the center marker and one half of the span to the right of the center marker. However, 0.5 MHz (i.e., one-half of the set span) to the right of 29.5 MHz gives 30 MHz, which is larger than the highest frequency of the 8192 data points (29.995 MHz). In this case, the span is automatically limited to (29.995−29.5)*2=0.99 MHz. The third example is referred to as being "too far to the right."

In a fourth example, the user sets the center frequency of the zoom graph to 0.5 MHz and the span to 1 MHz. However, the lowest frequency of the 8192 data points is 0.145 MHz, which is higher than the zero left boundary of the requested zoom graph span. The span is then automatically limited to (0.5−0.145)*2=0.71 MHz. The fourth example is referred to as being "too far to the left."

Returning to FIG. 4, it is also possible to provide a user with appropriate menus as the user toggles between graphs 401 and 402. In this example, a user may interact with one of graphs 401 and 402 at a time by selecting one graph or the other. Selection of a graph can be denoted by a visual indicator, such as highlighting or, in this example, contrasting border 405. As the user toggles, available actions presented in menu 404 may be added, omitted, and/or rearranged in order to present more appropriate choices to the user. Selecting a graph, denoting a selection with a contrasting border, and changing a menu in response to graph selection are previously known features that may be adapted for use in some embodiments of the present invention to increase user convenience.

Figure 5:
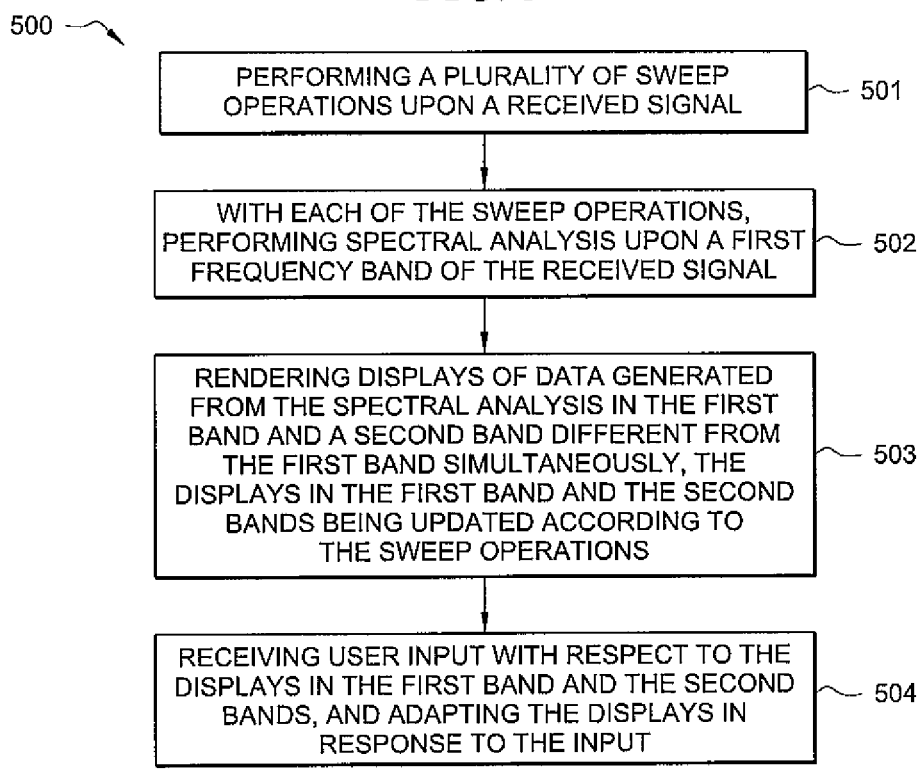
FIG. 5 is an illustration of an exemplary method adapted according to one embodiment of the invention.

FIG. 5 is an illustration of exemplary method 500 adapted according to one embodiment of the invention. Various portions of method 500 may be performed by hardware and/or software, such as by any of the possible configurations of system 300 (FIG. 3).

In step 501, a plurality of sweep operations are performed upon a received signal. In one example, each of the sweep operations provides samples that indicate amplitude at a number of given frequencies, and the samples are then sent to a processor.

In step 502, with each of the sweep operations, spectral analysis is performed upon a first frequency band of the received signal. Spectral analysis includes any analysis with respect to one or more frequencies present in the signal. In many embodiments, the spectral analysis includes discerning relative powers of frequency components in the signal. Further, frequency analysis can also include a variety of operations, e.g., various filtering techniques to remove unwanted artifacts from the response.

In step 503, displays of data generated from the spectral analysis in the first band and a second band different from the first band are rendered simultaneously, the displays in the first band and the second band being updated according to the sweep operations. In step 503, two displays are rendered—one for the first frequency band and one for a different frequency band. In many embodiments, the first band is a wide band, and the second band is a subset, or a zoomed-in portion of the first band. The displays are rendered based on the data generated from the spectral analysis of information from the sweep operations. Simultaneous rendering, as used herein, is meant only to describe rendering that would appear simultaneous to a user and may not be strictly simultaneous for reasons, e.g., related to display technology. For instance, various display processes, such as raster scanning, may render one display before rendering the other. Further, rendering may include very quickly rendering alternating updates of each of the displays. Such processes, and other processes, are within the scope of the embodiments, as long as they appear simultaneous or synchronized, to a human user. Likewise, synchronized displaying does not require exact simultaneity in the updating of two or more displays.

Step 503 is performed in many embodiments by driving both displays from the same set of data. For instance, in one embodiment, the samples are stored in computer-readable memory as they are generated (e.g., in processor 303 of FIG. 3), and the store of samples is then used to create both displays.

The first frequency band can be of any arbitrary span. In many embodiments, the first frequency band is a wide band, such as 700 MHz or more. Some wider and some narrower band can also be accommodated.

In step 504, user input is received with respect to the displays in the first band and the second bands, and the displays are adapted in response to the input. In some embodiments, when the user selects one display or the other, highlighting or other visual indication is applied to show which display is selected. Further, menus can be automatically changed in response to user selections, markers can be added, deleted, or moved, spans can be automatically adjusted, and the like. Step 504 is usually performed by a processor, such as processor 303 (FIG. 3), running one or more computer programs for rendering and changing the displays. However, various embodiments of the invention are not limited thereto, as step 504 may be performed a processor separate from a processor that performs spectral analysis. Further, such computer programs can be computer-executable code stored in memory, either on-chip or off-chip, in volatile or non-volatile memory, and/or received over a network, such as the Internet or a Local Area Network.

While method 500 is shown as a series of discrete steps, such illustration is for convenience only, as embodiments of the invention are not necessarily limited thereto. For instance, sweep operations, spectral analysis, and display rendering may be performed repeatedly and continuously such that steps 501, 502, and 503 are performed during the same time periods. Further, various embodiments may add, omit, or rearrange steps in method 500, such as by adding more signal processing (e.g., determining maximum amplitudes) and rendering the results of that signal processing on the displays.

Various embodiments of the invention may provide one or more advantages over prior art systems. For example, prior art split-screen systems require performing measurements for each of the graphs separately. Thus, a user of such system starts a measurement for a wide span, waits a few cycles for the graph to take a steady shape (assuming a steady shape is possible) and then shifts to the narrower span. The shift causes the updating of the wide span graph to cease, and the narrower span graph is then generated cycle-by-cycle. In contrast, embodiments of the present invention allow a user to have both graphs generated synchronously. Such feature may reduce time needed for a given test and may also provide more intuitive operation for a user.

Further, a second advantage is that various embodiments lose far less time-critical data than do prior art systems. As explained above, prior art split-screen systems generate measurements in each of the graphs separately, and for signals that vary with time, the two graphs may be very different. For instance, if an event occurs randomly within a signal, a user may be able to capture the event within a wide scan (using some diligence, of course). However, it can be much harder for the user to capture the random event during a narrow span part of the measurement. By contrast, various embodiments of the present invention may allow a user to see such events in both a wide and a narrow graph.

It should be noted that while the examples herein describe systems and methods providing two displays, the number of displays is not limited thereto. In fact, depending on, e.g., the power of a given processor and the number of display pixels available, three or more synchronized displays are possible and within the scope of embodiments.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for displaying signal analysis data, said method comprising;
   performing a plurality of sweep operations upon a received signal;
   with said sweep operations, performing spectral analysis upon a first frequency band of said received signal; and
   rendering displays of data generated from said spectral analysis in said first band and a second band different from said first band simultaneously, said displays in said first band and said second band both being continuously updated according to said sweep operations.

2. The method of claim 1 wherein said displays in said first band and said second band are included in a user interface, said user interface also including interactive user controls.

3. The method of claim 2 further comprising: receiving input in respect to said user interface; and adapting said user interface in response to said input.

4. The method of claim 3 wherein said displays in said first band and said second band are rendered upon a screen including a number of pixels, said rendering comprising: calculating a maximum span of said second band based at least in part on a size of a subset of said pixels available for displaying said display in said second band; receiving input indicating a desired span of said second band, said desired span being larger than said maximum span; and calculating a different appropriate span no larger than said maximum span.

5. The method of claim 1 wherein each sweep operation comprises: generating portions of said received signal at a plurality of frequency points within said first frequency band; and sampling and digitizing said generated portions of said received signal.

6. The method of claim 1 wherein said second band is narrower that said first band, and said second band comprises a portion of said first band.

7. The method of claim 1 wherein each of said displays in said first band and said second band comprises a graph of frequency versus amplitude.

8. A spectrum analyzer system comprising:
   a signal input receiving a signal;
   a sweep module performing a series of sweep operations upon said received signal; and
   a processor extracting spectral information from a first frequency band of said received signal with each sweep operation, said processor further generating display information including two synchronized and continuously-updating displays: a first display showing spectral information for said first frequency band; and a second display showing spectral information for a second frequency band smaller than said first frequency band.

9. The system of claim 8 wherein said sweep module comprises: a phase locked loop operable to perform within a band of one thousand Megahertz with a variance of less than two Megahertz.

10. The system of claim 8 wherein said sweep operations are locked loop sweeps over a range of at least seven hundred Megahertz.

11. The system of claim 8 wherein said processor is included in a general purpose computer, said general purpose computer further comprising: a screen receiving said display information and displaying said first and second displays using pixels.

12. The system of claim 8 wherein said sweep module comprises one or more of a bandpass filter and a superheterodyne receiver providing portions of the signal at a plurality of different frequency points.

13. The system of claim 12, said sweep module further comprising: an Analog-to Digital Converter (ADC) sampling and digitizing said portions of said signal.

14. The system of claim 8 further comprising: a user interface including interactive user controls, said processor adapting said user interface in response to user input.

15. The system of claim 14 wherein said processor performs the following function: calculating a maximum span of said second frequency band based at least in part on a size of a subset of pixels on a display screen available for displaying said second display and on a number of data points in said first frequency band produced by said sweep module; receiving input indicating a desired frequency span of said second display, said desired span being larger than said maximum band; calculating a different appropriate span no larger than said maximum span; and rendering said first and second displays on said display screen.

16. The system of claim 8 wherein said second frequency band is narrower that said first frequency band, and said second frequency band comprises a portion of said first frequency band, and wherein each of said first and second displays comprises a graph of frequency versus amplitude for said signal.

17. A signal analyzer system comprising:
   a sweeping component: receiving a signal and performing a series of sweeps on said signal, thereby providing portions of said signal at a plurality of frequency points within a first frequency band; sampling said portions of said signal; and
   a processing component: analyzing said signal using said samples, thereby discerning one or more frequency characteristics of said signal; and updating display information for a first display and a second display according to said sweep operations: said first display graphically depicting said one or more frequency characteristics in said first frequency band; and said second display graphically depicting said one or more frequency characteristics in a second frequency band, said second frequency band being narrower than said first frequency band; and a display component receiving said display information and presenting said displays upon a screen simultaneously.

18. The system of claim 17 wherein said first display and said second display are driven by data in common.

19. The system of claim 17 wherein said first and second displays are included in a user interface for display on said screen, said system automatically adjusting a bandwidth of said second display based at least in part on a number of available pixels in said screen.

* * * * *